United States Patent
Inao et al.

(10) Patent No.: US 9,492,986 B2
(45) Date of Patent: Nov. 15, 2016

(54) LAMINATE AND METHOD FOR SEPARATING THE SAME

(75) Inventors: Yoshihiro Inao, Kawasaki (JP); Yasushi Fujii, Kawasaki (JP);
(Continued)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 55 days.

(21) Appl. No.: 13/881,114

(22) PCT Filed: Oct. 7, 2011

(86) PCT No.: PCT/JP2011/073245
§ 371 (c)(1),
(2), (4) Date: Apr. 23, 2013

(87) PCT Pub. No.: WO2012/056867
PCT Pub. Date: May 3, 2012

(65) Prior Publication Data
US 2013/0213582 A1   Aug. 22, 2013

(30) Foreign Application Priority Data

Oct. 29, 2010 (JP) .................................. 2010-243153
Sep. 29, 2011 (JP) .................................. 2011-214817

(51) Int. Cl.
*B32B 38/10* (2006.01)
*B32B 7/06* (2006.01)
(Continued)

(52) U.S. Cl.
CPC . *B32B 7/06* (2013.01); *B32B 7/12* (2013.01); *B32B 9/04* (2013.01); *B32B 15/04* (2013.01);
(Continued)

(58) Field of Classification Search
CPC ............ H01L 2221/68381; H01L 2221/68386; Y10T 156/1158; Y10S 156/93; B32B 17/061
(Continued)

(56) References Cited

U.S. PATENT DOCUMENTS

| 4,909,806 A | 3/1990 | Garbe |
| 5,098,501 A | 3/1992 | Nishiguchi |

(Continued)

FOREIGN PATENT DOCUMENTS

| EP | 0 858 110 A1 | 8/1998 |
| EP | 1 351 308 A1 | 10/2003 |

(Continued)

OTHER PUBLICATIONS

Silverstein et al., "Spectrometric Identification of Organic Compounds," Yuukikagoubutsu no supekutoru niyoru douteihou, Fifth Edition,—MS, IR, NMR, UV no heiyou—, pp. 146-151, 1992.
(Continued)

*Primary Examiner* — Mark A Osele
(74) *Attorney, Agent, or Firm* — Knobbe Martens Olson & Bear LLP

(57) ABSTRACT

A laminate including a supporting member which is light transmissive; a supported substrate supported by the supporting member; an adhesive layer provided on a surface of the supported substrate which surface faces toward the supporting member; and a release layer which is made of an inorganic material and is provided between the supporting member and the supported substrate, the release layer having a property that changes when the release layer absorbs light coming through the supporting layer, and the release layer having a flat surface which faces the adhesive layer.

7 Claims, 2 Drawing Sheets

(1) LASER BEAM IRRADIATION (2) PROPERTY CHANGE OF RELEASE LAYER (3) SUPPORTING MEMBER IS SEPARATED

(75) Inventors: Atsushi Matsushita, Kawasaki (JP);
Koki Tamura, Kawasaki (JP); Atsushi Kubo, Kawasaki (JP)

(51) Int. Cl.
| | |
|---|---|
| *B32B 43/00* | (2006.01) |
| *H01L 21/683* | (2006.01) |
| *B32B 7/12* | (2006.01) |
| *B32B 9/04* | (2006.01) |
| *B32B 15/04* | (2006.01) |
| *B32B 17/06* | (2006.01) |

(52) U.S. Cl.
CPC ............ *B32B 17/06* (2013.01); *B32B 17/061* (2013.01); *B32B 43/006* (2013.01); *H01L 21/6835* (2013.01); *H01L 2221/6834* (2013.01); *H01L 2221/68327* (2013.01); *Y10T 156/1158* (2015.01); *Y10T 428/30* (2015.01); *Y10T 428/31678* (2015.04)

(58) Field of Classification Search
USPC ................................................ 156/712, 930
See application file for complete search history.

(56) References Cited

U.S. PATENT DOCUMENTS

| | | | |
|---|---|---|---|
| 5,752,442 A | 5/1998 | Johnson et al. | |
| 6,881,765 B2 | 4/2005 | Sasaki | |
| 6,896,760 B1 | 5/2005 | Connell et al. | |
| 6,897,004 B2 | 5/2005 | Uenishi et al. | |
| 6,911,375 B2 * | 6/2005 | Guarini ............... | H01L 21/6835 257/E21.568 |
| 6,930,023 B2 * | 8/2005 | Okada .................... | B24B 7/228 257/E21.237 |
| 7,108,955 B2 | 9/2006 | Iwasawa et al. | |
| 7,297,613 B1 * | 11/2007 | Mountain .................... | 438/458 |
| 7,384,811 B2 * | 6/2008 | Miyamoto ........ | H01L 21/67132 438/113 |
| 7,387,949 B2 * | 6/2008 | Fukazawa ......... | H01L 21/76898 257/214 |
| 7,462,551 B2 | 12/2008 | Kulkarni et al. | |
| 7,883,991 B1 | 2/2011 | Wu et al. | |
| 8,173,519 B2 * | 5/2012 | Morisue et al. .............. | 438/458 |
| 9,269,561 B2 * | 2/2016 | Dang ................ | H01L 21/02002 |
| 2003/0019576 A1 | 1/2003 | Torres-Filho et al. | |
| 2003/0024635 A1 * | 2/2003 | Utsunomiya .............. | 156/272.2 |
| 2004/0016504 A1 | 1/2004 | Mitarai | |
| 2004/0241934 A1 | 12/2004 | Inoue | |
| 2005/0130391 A1 | 6/2005 | Takayama et al. | |
| 2005/0233547 A1 | 10/2005 | Noda et al. | |
| 2006/0231527 A1 | 10/2006 | Takayama et al. | |
| 2008/0014532 A1 | 1/2008 | Kessel et al. | |
| 2009/0111279 A1 | 4/2009 | Sakashita | |
| 2009/0115075 A1 | 5/2009 | Kessel et al. | |
| 2009/0133812 A1 | 5/2009 | Noda et al. | |
| 2009/0249604 A1 | 10/2009 | Nakamura | |
| 2010/0038035 A1 | 2/2010 | Noda et al. | |
| 2010/0041211 A1 | 2/2010 | Noda et al. | |
| 2010/0096080 A1 | 4/2010 | Ohya et al. | |
| 2010/0155936 A1 | 6/2010 | Codding et al. | |
| 2010/0273326 A1 | 10/2010 | Nakamura et al. | |
| 2011/0031620 A1 | 2/2011 | Codding et al. | |
| 2011/0067808 A1 | 3/2011 | Nishio et al. | |
| 2011/0091811 A1 | 4/2011 | Song et al. | |
| 2011/0139375 A1 | 6/2011 | Yamamoto et al. | |
| 2011/0195248 A1 | 8/2011 | Kiuchi et al. | |
| 2011/0297771 A1 | 12/2011 | Noda et al. | |
| 2014/0151328 A1 | 6/2014 | Miyanari et al. | |
| 2014/0255638 A1 | 9/2014 | Imai et al. | |
| 2014/0332149 A1 | 11/2014 | Fujii et al. | |
| 2015/0010724 A1 | 1/2015 | Ogata et al. | |

FOREIGN PATENT DOCUMENTS

| | | |
|---|---|---|
| EP | 1 655 633 A2 | 5/2006 |
| EP | 1 744 365 A2 | 1/2007 |
| EP | 1 758 169 A2 | 2/2007 |
| JP | 07-256812 A | 10/1995 |
| JP | A-10-125929 | 5/1998 |
| JP | 2002-217390 | 8/2002 |
| JP | 2002-226796 | 8/2002 |
| JP | A-2004-64040 | 2/2004 |
| JP | 2004-238464 | 8/2004 |
| JP | A-2005-183689 | 7/2005 |
| JP | A-2005-197673 | 7/2005 |
| JP | 2005-302982 | 10/2005 |
| JP | A-2007-188967 | 7/2007 |
| JP | 2007-258663 A | 10/2007 |
| JP | 2008-041987 | 2/2008 |
| JP | 2008-166578 | 7/2008 |
| JP | 2009-263316 | 11/2009 |
| JP | 2009-263596 | 11/2009 |
| JP | 2010-098072 | 4/2010 |
| JP | 2010-120901 A | 6/2010 |
| JP | 2010-165802 | 7/2010 |
| KR | 2009-0031562 | 3/2009 |
| WO | WO 2008/146438 | 12/2008 |

OTHER PUBLICATIONS

International Search Report issued in International Patent Application No. PCT/JP2011/069173 on Nov. 22, 2011.
Office Action issued in U.S. Appl. No. 13/290,412 on Nov. 21, 2013.
International Search Report issued in Application No. PCT/JP2011/073245 on Dec. 27, 2011.
Office Action in U.S. Appl. No. 14/183,988, mailed Sep. 26, 2014.
Office Action in U.S. Appl. No. 14/183,988, mailed Sep. 18, 2015.
Final Office Action in U.S. Appl. No. 14/183,988, mailed Apr. 24, 2015.
First notification of Office Action in corresponding Japanese Patent Application No. 2011-214817, dated Nov. 4, 2015.
Office Action for Taiwanese Application No. 100138887, dated Oct. 8, 2015.

\* cited by examiner

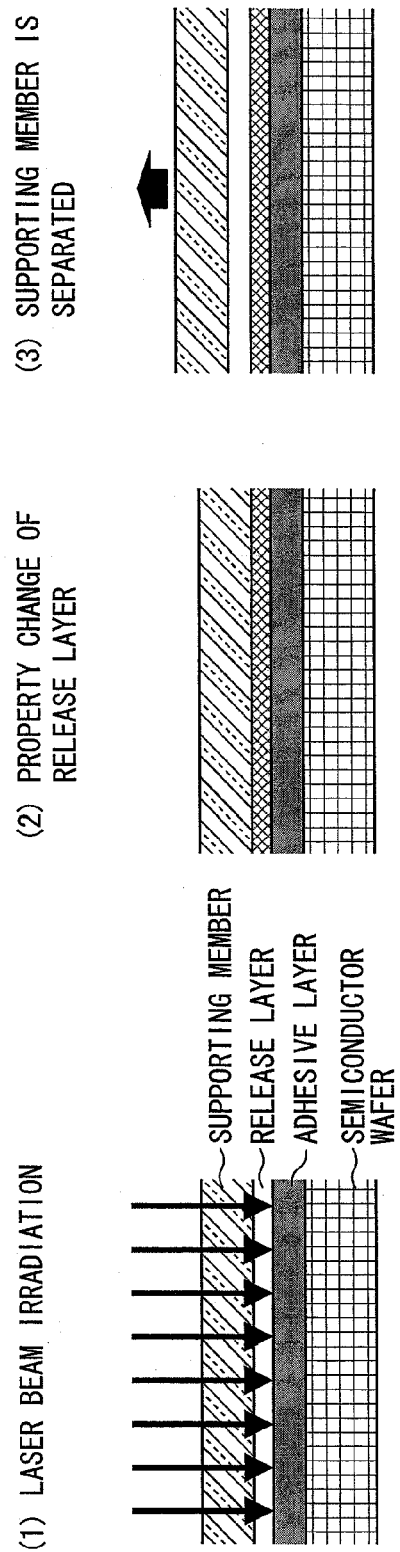

LAMINATE AND METHOD FOR SEPARATING THE SAME

This application is the U.S. National Phase under 35 U.S.C. §371 of International Application No. PCT/JP2011/073245, filed Oct. 7, 2011, designating the U.S., and published in Japanese as WO 2012/056867 on May 3, 2012, which claims priority to Japanese Patent Application No. 2010-243153, filed Oct. 29, 2010; and to Japanese Patent Application No. 2011-214817, filed Sep. 29, 2011. The entire content of these priority applications is incorporated herein by reference.

TECHNICAL FIELD

The present invention relates to (i) a laminate produced by adhering together a supporting member and a supported substrate supported by the supporting member and (ii) a method for separating the laminate.

BACKGROUND ART

As mobile phones, digital AV devices, IC cards and the like are highly functionalized, it is more demanded that a semiconductor silicon chip (hereafter referred to as "chip") be highly integrated in a package by making a mounted chip smaller and thinner. For instance, there is a demand for thinning of an integrated circuit obtained by packaging a plurality of chips, such as CSP (chip size package) and MCP (multi-chip package). In order to fulfill high integration of a chip in a package, it is necessary to thin a chip down to a range of 25 μm to 150 μm.

However, a semiconductor wafer (hereafter referred to as "wafer") serving as a base of a chip becomes thin by grinding. Therefore, strength of the wafer decreases. This is likely to result in a crack or a warpage in the wafer. Furthermore, it is difficult to automatically carry the wafer whose strength decreases due to its smaller thickness. Therefore, it is necessary to manually carry the wafer and it is troublesome to handle the wafer.

For this reason, there has been developed a wafer handling system for reinforcement of a wafer, by which to adhere a plate called "support plate" which is composed of glass, silicon, hard plastic or the like, to a wafer to be ground, thereby preventing a crack and a warpage in the wafer. Since the wafer handling system can reinforce a wafer, it is possible to automatically carry a semiconductor wafer having been made thinner.

In the wafer handling system, (i) a wafer and a support plate are adhered together with the use of various kinds of thermoplastic resins or adhesives, (ii) the wafer adhered to the support plate is thinned, and then (iii) the support plate is separated from the wafer prior to dicing of the wafer. In order to thin the wafer to 150 μm or less, for example, it is highly preferable to firmly adhere the wafer and the support plate together.

CITATION LIST

Patent Literatures

Patent Literature 1
Japanese Patent Application Publication, Tokukai, No. 2007-188967 A (Publication Date: Jul. 26, 2007)
Patent Literature 2
Japanese Patent Application Publication, Tokukai, No. 2004-64040 A (Publication Date: Feb. 26, 2004).

SUMMARY OF INVENTION

Technical Problem

However, in a case where a wafer and a support plate are firmly adhered together, it may be difficult to separate the support plate from the wafer without damaging the wafer, depending on an adhesive used. This is because, while a strong adhesive is effective in thinning of a wafer, such an adhesive causes damage to the wafer having a reduced strength when the support plate is separated from the wafer.

In view of the circumstances, the automation of the wafer handling system requires development of an extremely difficult temporary-fixing technique that enables, while achieving temporary and yet firm fixing of a wafer to a support plate, separation of the wafer from the support plate without damaging the wafer.

The present invention has been made in view of the foregoing problem, and it is an object of the present invention to provide (i) a laminate configured such that a target object is firmly adhered to and supported by a supporting member but the supporting member can be easily separated from the target object and (ii) a method for separating the laminate.

Solution to Problem

A laminate of the present invention includes: a supporting member which is light transmissive; a supported substrate supported by the supporting member; an adhesive layer provided on a surface of the supported substrate which surface faces toward the supporting member; and a release layer which is made of an inorganic material and is provided between the supporting member and the supported substrate, the release layer having a property that changes when the release layer absorbs light coming through the supporting member, and the release layer having a flat surface which faces the adhesive layer.

A separation method of the present invention is a method for separating a supporting member and a supported substrate from each other which are included in a laminate, the laminate including: the supporting member which is light transmissive; the supported substrate supported by the supporting member; an adhesive layer provided on a surface of the supported substrate which surface faces toward the supporting member; and a release layer which is made of an inorganic material and is provided between the supporting member and the supported substrate, the release layer having a property that changes when the release layer absorbs light coming through the supporting member, said method, including the step of: changing the property of the release layer by irradiating the release layer with light through the supporting member.

Advantageous Effects of Invention

The present invention makes it possible to provide (i) a laminate configured such that a target object is firmly adhered to and supported by a supporting member but the supporting member can be easily separated from the target object and (ii) a method for separating the laminate.

BRIEF DESCRIPTION OF DRAWINGS

FIG. 2 is a view illustrating a method for separating a laminate of the present invention.

DESCRIPTION OF EMBODIMENTS

[Laminate]

Figure 1:
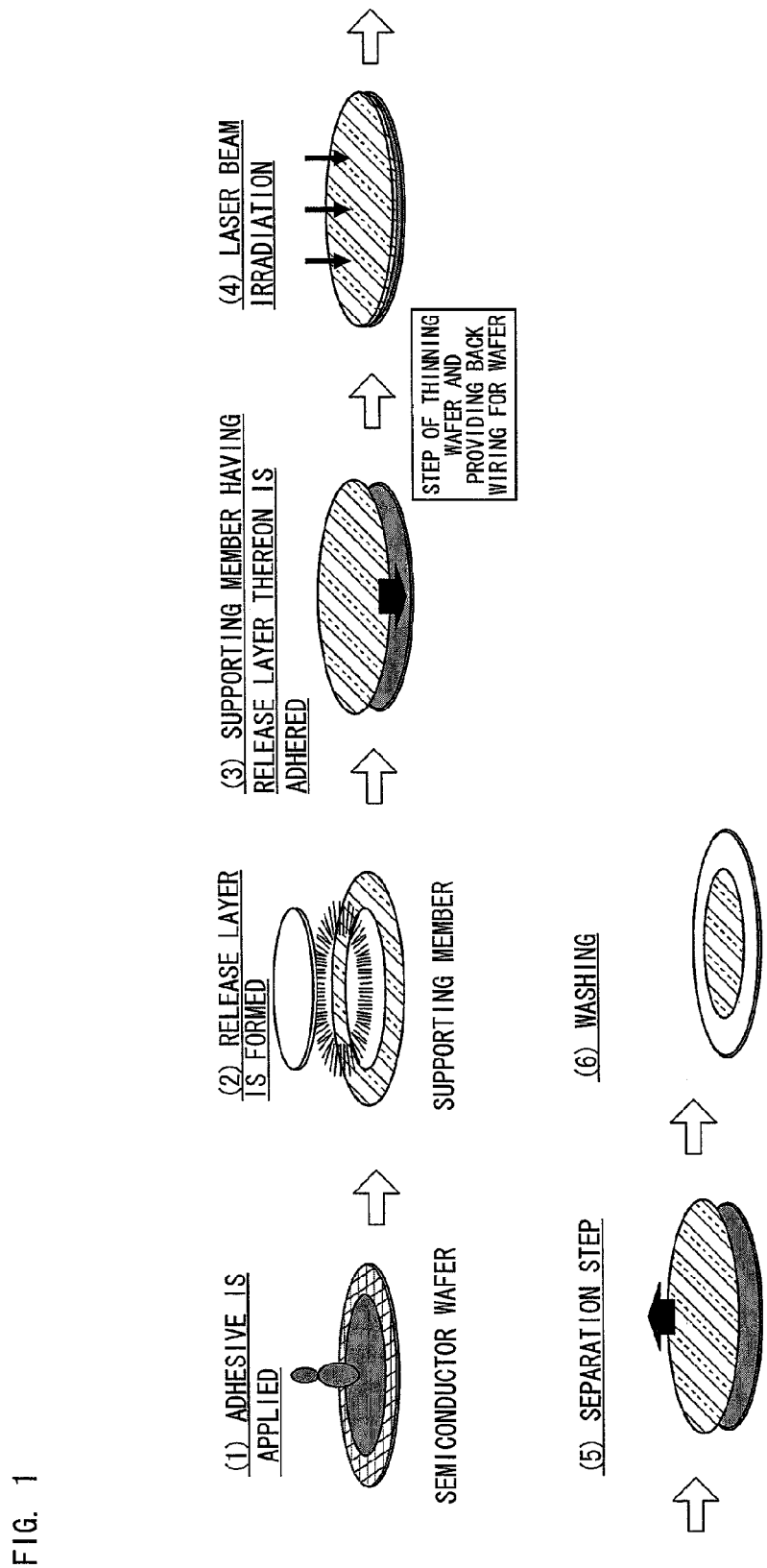
FIG. 1 is a view illustrating (i) a method for producing a laminate of the present invention and (ii) a process of separating a semiconductor wafer from the laminate.

A laminate of the present invention includes (i) a supporting member that is light transmissive, (ii) a supported substrate supported by the supporting member, (iii) an adhesive layer provided on a surface of the supported substrate which surface faces toward the supporting member, and (iv) a release layer which is provided between the supporting member and the supported substrate and is made of an inorganic material. The release layer has a property changes when the release layer absorbs light coming through the supporting member, and has a flat surface which faces the adhesive layer.

In other words, the laminate of the present invention is constituted by the supported substrate, the adhesive layer, the release layer, and the supporting member which are stacked together in this order. The supported substrate is temporarily fixed to the supporting member via the adhesive layer and the release layer.

The laminate of the present invention can be used for any purpose, provided that the supported substrate is temporarily fixed to the supporting member. The present embodiment discusses an example of a laminate which is (i) for use in a wafer support system and (ii) constituted by a support plate (supporting member) and a semiconductor wafer (supported substrate) temporarily fixed to the support plate.

(Release Layer)

As described above, the laminate of the present invention includes the release layer made of an inorganic material. Since the release layer is made of an inorganic material, the release layer changes its property upon absorbing light. As a result, the release layer loses strength or adhesion that it had before the light irradiation. Hence, it is possible to easily separate the supported substrate from the supporting member by applying a little external force (for example, by lifting up the supporting member), because the release layer is broken by the little external force.

The inorganic material for the release layer is not particularly limited, provided that it changes its property upon absorbing light. A preferable example of the inorganic material is at least one selected from the group consisting of metals, metal compounds, and carbon. The term "metal compound" means a compound containing metal atoms, and a metal compound can be, for example, a metal oxide or a metal nitride. Such an inorganic material is, but not limited to, at least one selected from the group consisting of (i) metals such as gold, platinum, palladium, cobalt, rhodium, iridium, calcium, ruthenium, osmium, manganese, molybdenum, tungsten, niobium, tantalum, bismuth, antimony, lead, silver, copper, iron, nickel, aluminum, titanium, chrome, tin, and alloys of these metals, (ii) metal compounds such as $SiO_2$, SiN, $Si_3N_4$, and TiN, and (iii) carbon. The concept of carbon includes allotropic forms of carbon. For example, carbon can be diamond, fullerene, diamond-like carbon, or a carbon nanotube. A preferable metal is at least one selected from gold, silver, copper, iron, nickel, aluminum, titanium, chrome, and alloys of these metals. A preferable alloy is a silver-tin alloy.

Different types of inorganic materials absorb light having different wavelength ranges. By irradiating the release layer with light corresponding to a range of wavelengths that the inorganic material constituting the release layer absorbs, it is possible to suitably change the property of the inorganic material.

Light for irradiation of the release layer need only be suitably selected according to a wavelength that the inorganic material absorbs. Examples of the light encompass (i) laser beams produced by (a) solid-state lasers such as a YAG laser, a ruby laser, a glass laser, a $YVO_4$ laser, an LD laser, and a fiber laser, (b) liquid lasers such as a dye laser, (c) gas lasers such as a $CO_2$ laser, an excimer laser, an Ar laser, and an He—Ne laser, (d) semiconductor lasers, and (e) free electron lasers and (ii) light other than laser beams.

In this specification, the phrase "an inorganic material changes its property" means bringing about (i) a state in which a release layer made of the inorganic material is readily broken when a little external force is applied thereto or (ii) a state in which the adhesion is weak between the release layer and a member in contact with the release layer.

The release layer can be formed on the supporting member by a known technique such as sputtering, chemical vapor deposition (CVD), plating, plasma CVD, or spin coating. A thickness of the release layer is not particularly limited, provided that the release layer is thick enough to adequately absorb light being used. Note, however, that it is preferable that the release layer has a thickness of, for example, 0.1 µm to 10 µm.

The laminate can be produced by (i) applying an adhesive to one or both surface(s) of an inorganic film (e.g. a metal film) which is made of an inorganic material and constitutes the release layer and then (ii) adhering the inorganic film to the supporting member and to the supported substrate.

Note that, in a case where the release layer is constituted by a metal film, for example reflection of a laser beam and/or electrification of the metal film would possibly occur, depending on the property of the release layer, type of a laser being used, laser power, and other conditions. Therefore, it is preferable to prevent such reflection and electrification by providing an anti-reflection film(s) and/or an antistatic film(s) on one or both surface(s) of the release layer.

As described above, the release layer is provided between the supporting member and the adhesive layer. That is, there is the adhesive layer between the release layer and the supported substrate. This makes it possible to prevent light, which passes through the supporting member and strikes the release layer, from reaching the supported substrate. Therefore, in a case where the supported substrate has, on its surface in contact with the adhesive layer, a microstructure etc. that requires protection, it is possible to prevent such a microstructure from being adversely affected by light irradiation.

Furthermore, since a surface of the release layer which surface faces the adhesive layer is flat (i.e. there is no unevenness), it is possible to easily form the release layer and also possible to adhere the release layer to the adhesive layer uniformly.

Note that the laminate of the present invention may further include at least one additional layer between the release layer and the supporting member. In this case, the additional layer is made of a light transmissive material. This means that it is possible to add, to the laminate as appropriate, a layer which imparts preferable properties etc. to the laminate without blocking light travelling to the release layer. Note that different types of inorganic materials (for the release layer) require light having different wavelengths to change their properties. Therefore, a material constituting the additional layer does not need to be one that transmits all wavelengths of light. The material can be selected as appropriate from those which transmit light having wavelengths at which the inorganic material changes its property. In any case, since (i) the release layer is fixed to the supporting member directly or via an additional layer and (ii) the release layer and the supported substrate are adhered together via the adhesive layer, the supported substrate is temporarily fixed to the supporting member. For example, the additional layer can be an adhesive layer via which the release layer and the supporting member are adhered together.

(Supporting Member)

As described earlier, the supporting member is light transmissive. This is to cause external light, which shines on the laminate from outside, to pass through the supporting member and reach the release layer. Therefore, the supporting member does not need to transmit all wavelengths of light, and only needs to transmit light that the release layer absorbs (i.e. light having a desired wavelength(s)).

The supporting member is a member that supports the supported substrate. Therefore, the strength of the supporting member need only be high enough to prevent, in a case where the supported substrate is processed or transported, the supported substrate from being damaged or deformed.

The supporting member is made from, for example, glass or silicon etc. Note, however, that the supporting member can be made from any material provided that the supporting member has properties which can accomplish the above purposes.

(Adhesive Layer)

The adhesive layer is a member which covers and protects a surface of the supported substrate as well as fixes the supported substrate to the supporting member. Therefore, the adhesive layer needs to have enough adhesion and strength so that, while the supported substrate is being processed or transported, the supported substrate does not detach from the supporting member and the surface, which requires protection, of the supported substrate is not exposed. On the other hand, it is necessary that the adhesive layer be easily detachable or removable from the supported substrate when the supported substrate does not have to be fixed to the supporting member anymore.

Therefore, the adhesive layer is usually constituted by an adhesive which (i) is highly adhesive and (ii) becomes less adhesive as a result of some process or is soluble in a particular solvent. Examples of the adhesive which can be used for the adhesive layer of the present invention encompass various adhesives known in the field, such as acrylic adhesives, novolac adhesives, naphthoquinone adhesives, hydrocarbon adhesives, and polyimide adhesives.

Note that it is preferable that the adhesive layer is formed from a resin other than a photo-curable resin (e.g. UV-curable resin). This is because a residue of the photo-curable resin may remain around fine protrusions and depressions on the surface of the supported substrate after the adhesive layer is detached or removed. It is especially preferable that the adhesive layer is constituted by an adhesive that is soluble in a particular solvent. This is because such an adhesive can be removed by being dissolved in the solvent without applying a physical force to the supported substrate. That is, such an adhesive can be easily removed even from a supported substrate having a reduced strength without causing damage or deformation to/of the supported substrate.

[Method for Producing Laminate]

The following description will discuss, with reference to FIG. 1, a method for producing the laminate of the present invention. FIG. 1 is a view illustrating (i) the method for producing the laminate and (ii) a process of separating a semiconductor wafer from the laminate.

First, as illustrated in FIG. 1, an adhesive is applied to a surface of a semiconductor wafer (supported substrate) which surface has a desired device thereon (step (1) in FIG. 1). The adhesive applied to the semiconductor wafer here is, for example, one that is dissolved in a solvent. Then, the adhesive is baked in stages at increasing temperatures, whereby the adhesive hardens and forms an adhesive layer.

Next, a film of the foregoing inorganic material is formed on a surface of a supporting member (supporting member) by sputtering or plating. In this way, a release layer is formed (step (2) in FIG. 1).

Then, the adhesive layer formed on the surface of the semiconductor wafer and the release layer formed on the surface of the supporting member are placed against each other, and pressure is applied in a vacuum at 200° C. so that the adhesive layer and the release layer are adhered together (step (3) in FIG. 1).

In this way, the laminate of the present invention can be produced. Note that how to form an adhesive layer and a release layer and how to adhere them together are selected as appropriate from a variety of conventional methods, according to (i) a condition (unevenness on a surface or strength etc.) of the supported substrate and (ii) materials for the adhesive layer, the release layer, and the supporting member.

The laminate is then subjected to processing of the semiconductor wafer. After that, light irradiation, separation of the supporting member, and removal of the adhesive layer are carried out, whereby only the semiconductor wafer remains.

[Method for Separating the Laminate]

Next, the following description will discuss, with reference to FIGS. 1 and 2, the step after the processing of the semiconductor wafer to the step of removing the semiconductor wafer. FIG. 2 is a view for describing a method for separating the laminate.

As illustrated in FIG. 1, after the processing of the semiconductor wafer, the laminate receives a laser beam on its supporting member-side surface (step (4) in FIG. 1). Upon receiving the laser beam (step (1) of FIG. 2), the release layer changes its property (step (2) in FIG. 2).

Next, the semiconductor wafer is separated from the supporting member (step (5) in FIG. 1). The release layer, whose property has changed, has a significantly reduced strength. Therefore, the release layer can be easily broken by, for example, applying a little external force to lift up the supporting member. This separates the supporting member from the laminate (step (3) in FIG. 2).

The adhesive layer is removed by spraying a solvent to the adhesive layer (step (6) in FIG. 1). Note here that, after the separation of the supporting member, there is a possibility that a residue of the release layer remains on the adhesive layer. If the amount of the residue is small, the solvent for dissolving the adhesive layer as described above is all that is necessary. Note, however, that a solvent for dissolving a material for the release layer may be sprayed prior to the removal of the adhesive layer.

As has been described, since the laminate of the present invention includes the foregoing release layer, it is possible to easily separate, by light irradiation, the supporting member from the supported substrate.

Note that, although a separation method of the present invention is suitable for separation of the laminate of the present invention, this does not imply any limitation on the present invention. The separation method of the present invention is also applicable to separation of, for example, a laminate in which a release layer has a non-flat surface facing an adhesive layer, provided that the release layer included in the laminate is made of an inorganic material.

EXAMPLES

The following description will discuss examples of a laminate in accordance with the present invention. Note that the following examples serve solely to assist the understanding of the present invention, and do not in any way limit the scope of the present invention.

Example 1

Production of Laminate

A laminate in accordance with Example 1 was produced in the following manner. A film of aluminum was formed by sputtering on a glass supporting member having a thickness of 0.7 mm. In this way, a glass supporting member on which a release layer having a thickness of 0.2 μm was formed was obtained. Note that a surface of the release layer was flat.

Next, on a semiconductor wafer substrate (an unground silicon wafer having a diameter of 150 mm) having a thickness of 725 μm, a hydrocarbon adhesive "TZNR-A3007" (manufactured by TOKYO OHKA KOGYO Co., Ltd.) was applied so that the thickness of the hydrocarbon adhesive after baking would be 50 μm. Then, the hydrocarbon adhesive was baked in stages at 90° C., 160° C. and 220° C. for 15 minutes each, thereby forming an adhesive layer on the semiconductor wafer substrate. Then, the release layer and the adhesive layer were placed against each other and adhered together, thereby obtaining the laminate.

(Evaluation of Separability)

The laminate in accordance with Example 1 was subjected to processing described below, and then whether or not the glass supporting member was separable from the semiconductor wafer substrate was evaluated.

The semiconductor wafer substrate of the laminate thus obtained was thinned. Then, the release layer was irradiated with an infrared laser beam having a wavelength of 1064 nm or 1090 nm which comes from a glass supporting member-side of the laminate. Specifically, the laminate was irradiated with an infrared laser beam having a wavelength of 1064 nm or 1090 nm and a beam shape of 60 μm per side, with a scan pitch of 120 μm and a scan rate of 3000 mm/sec. The infrared laser beam was emitted under the condition where an average power was 1.3 W to 5.2 W and a pulse frequency was 30 kHz to 200 kHz. The laminate was scanned with the infrared laser beam once.

As a result, the release layer of the laminate in accordance with Example 1 changed its property both in a case of irradiation with a laser beam having a wavelength of 1064 nm and in a case of irradiation with a laser beam having a wavelength of 1090 nm. The glass supporting member was easily separated from the semiconductor wafer substrate only by being lifted up. Furthermore, surfaces of the glass supporting member and the semiconductor wafer substrate were visually checked after the separation of the glass supporting member. As a result, no residues were found, although (i) the aluminum became tarnished and (ii) a small amount of an inorganic material which changed into black powder remained on the semiconductor wafer substrate.

As described above, by making the release layer of the laminate from an inorganic material, it was possible to very easily separate the supported substrate from the supporting member by changing a property of the release layer by laser irradiation.

Example 2

A laminate in accordance with Example 2 was produced in the following manner. On a glass supporting member having a thickness of 0.7 mm, a 1-methoxy-2-propanol acetate dispersion containing 25% silver-tin compound (detailed composition: silver (Ag) and a silver-tin compound (AgSn): 20 wt % to 30 wt %, 1-methoxy-2-propanol acetate: 65 wt % to 75 wt %, and a dispersion: 1% to 5%) was applied by spin coating. Then, the dispersion on the glass supporting member was baked in stages at 100° C., 160° C. and 220° C. for 2 minutes each. In this way, a glass supporting member on which a release layer having a thickness of 0.25 μm was formed was obtained. A surface of the release layer was flat. Subsequently, the same processes as in Example 1 were carried out, and whether or not the glass supporting member was separable from the semiconductor wafer substrate was evaluated.

As a result, also in Example 2, as is the case with Example 1, it was possible to very easily separate the supported substrate from the supporting member by changing a property of the release layer by laser irradiation.

INDUSTRIAL APPLICABILITY

According to the present invention, it is possible to provide a temporarily fixed laminate for use in production of various products. Particularly, it is possible to provide a laminate suitable for a step of temporarily fixing a semiconductor wafer or a chip on a variety of supporting members and processing the semiconductor wafer or the chip.

What is claimed is:

1. A method for separating a supporting member and a silicon wafer from each other which are included in a laminate, the laminate including:
    the supporting member which is light transmissive;
    the silicon wafer supported by the supporting member;
    an adhesive layer provided on a surface of the silicon wafer, wherein said surface faces toward the supporting member; and
    a release layer which is made of an inorganic material and is provided between the supporting member and the silicon wafer, wherein
    the release layer has a property that changes so that the release layer has a reduced material strength when it absorbs light coming through the supporting member,
    wherein the supporting member, the release layer, the adhesive layer, and the silicon wafer are stacked together in this order in the laminate,
    said method comprising changing the property of the release layer so that the release layer has a reduced material strength by irradiating the release layer with light through the supporting member; and
    breaking the release layer.

2. The method as set forth in claim 1, wherein the inorganic material is at least one selected from the group consisting of a metal, a metal compound, and carbon.

3. The method as set forth in claim 1, wherein the inorganic material is at least one selected from the group consisting of gold, platinum, palladium, cobalt, rhodium, iridium, calcium, ruthenium, osmium, manganese, molybdenum, tungsten, niobium, tantalum, bismuth, antimony, lead, silver, copper, iron, nickel, aluminum, titanium, chrome, tin, alloys of these metals, $SiO_2$, SiN, $Si_3N_4$, TiN, and carbon.

4. The method as set forth in claim 1, further comprising at least one layer provided between the supporting member and the release layer.

5. The method as set forth in claim 1, wherein the adhesive layer is made of a hydrocarbon adhesive.

6. A laminate comprising:
a supporting member which is light transmissive;
a silicon wafer supported by the supporting member;
an adhesive layer provided on a surface of the silicon wafer, wherein said surface faces toward the supporting member; and
a release layer which is made of an inorganic material and is provided between the supporting member and the silicon wafer,
the release layer having a property that changes so that the release layer has a reduced material strength when it absorbs light coming through the supporting member,
the release layer having a flat surface which faces the adhesive layer, and wherein the supporting member, the release layer, the adhesive layer, and the silicon wafer are stacked together in this order, wherein:
the inorganic material is a metal or a metal compound; and
the laminate comprises, on at least one surface of the release layer, an anti-reflection film or an antistatic film.

7. The laminate as set forth in claim 6, wherein the adhesive layer is made of a hydrocarbon adhesive.

* * * * *